United States Patent
Wang et al.

(10) Patent No.: US 6,693,462 B1
(45) Date of Patent: *Feb. 17, 2004

(54) LOW POWER DYNAMIC LOGIC GATE WITH FULL VOLTAGE SWING AND TWO PHASE OPERATION

(75) Inventors: Lei Wang, Sunnyvale, CA (US); Qiang Li, Fremont, CA (US)

(73) Assignee: Piconetics, Inc., Fremont, CA (US)

( * ) Notice: Subject to any disclaimer, the term of this patent is extended or adjusted under 35 U.S.C. 154(b) by 0 days.
This patent is subject to a terminal disclaimer.

(21) Appl. No.: 10/139,040

(22) Filed: May 3, 2002

Related U.S. Application Data

(63) Continuation-in-part of application No. 10/087,604, filed on Mar. 1, 2002, now Pat. No. 6,552,574.

(51) Int. Cl.[7] .................. H03K 19/096; H03K 19/20
(52) U.S. Cl. ............................ 326/98; 326/119
(58) Field of Search .................. 326/93, 95–98, 326/112, 119, 121, 114

(56) References Cited

U.S. PATENT DOCUMENTS

| | | | |
|---|---|---|---|
| 4,017,741 A | * | 4/1977 | Briggs .................... 377/79 |
| 5,473,270 A | * | 12/1995 | Denker .................... 326/95 |
| 6,150,848 A | * | 11/2000 | Fouts et al. ............... 326/96 |

FOREIGN PATENT DOCUMENTS

| | | | |
|---|---|---|---|
| JP | 07249982 A | * 9/1995 | ......... H03K/19/096 |

* cited by examiner

*Primary Examiner*—James H Cho
(74) *Attorney, Agent, or Firm*—Anthony B. Diepenbrock, III; Dechert LLP

(57) ABSTRACT

A logic circuit for evaluating a logic function while a signal on a clock input is a logic high. The logic circuit pre-discharges an output node to the logic low of the signal on the clock input and then charges the output node to logic high from the clock input when the logic function of the input is such as to require the output node to change state. The pre-discharge path is an n-channel transistor that is conductive only when the signal on the clock input is low. Also disclosed is a logic circuit that evaluates a logic function while a signal on the clock input is a logic high and while the signal on the clock input is a logic low, thereby permitting logic evaluations on both phases of the signal on the clock input.

11 Claims, 5 Drawing Sheets

1

LOW POWER DYNAMIC LOGIC GATE WITH FULL VOLTAGE SWING AND TWO PHASE OPERATION

CROSS-REFERENCE TO RELATED APPLICATIONS

This application is of and claims the filing date of U.S. application Ser. No. 10/087,604 entitled "LOW POWER DYNAMIC LOGIC GATE WITH FULL VOLTAGE SWING OPERATION" filed on Mar. 1, 2002 (now U.S. Pat. No. 6,552,574), and incorporated by reference into the present application.

FIELD OF THE INVENTION

This invention is related generally to reduced power logic and more specifically to reduced power logic having full voltage output swing and operating with recycled energy.

DESCRIPTION OF THE RELATED ART

In related application, "LOW POWER DYNAMIC LOGIC GATE WITH FULL VOLTAGE SWING OPERATION" a full voltage swing logic gate is disclosed. The full swing logic gate is configured to be precharged during a first phase of an input clock and to evaluate a logic function of its inputs on a second phase of the input clock. FIG. 1 shows a precharge path 10 under the control of a control circuit 12 by which the output node 20 of the circuit is precharged during a first phase of the clock 16 and a logic path 14 by which the logic function of the input 22 is evaluated during a second phase of the clock 16.

FIG. 2 shows an embodiment of the invention, an inverter 24, disclosed in the above-mentioned related application. The inverter 24 uses n-channel transistor 26 as the discharge path 14 and a p-channel transistor 28 as the precharge path 10. The control circuit includes a diode-connected p-channel transistor 30 and a diode-connected n-channel transistor 32, connected in parallel, between the drain and gate of the precharge transistor 28.

In operation, according to FIG. 3, when the signal on the clock input 16 is high, the p-channel precharge transistor 28 charges the output node 20 to a voltage substantially close to the high voltage of clock signal ($V_H$–$V_\delta$), where $V_H$ is the high voltage of the clock signal and $V_\delta$ is the drop across the transistor channel while in the constant-current region. $V_\delta$ can be made sufficiently small by adjusting the channel width-length ratio (W/L). When the signal on the clock input 16 is low, the n-channel logic path 14 evaluates the logic input 22 and depending on whether the input 22 is high or low, may discharge the output node 20 to a voltage substantially close to the low voltage $V_L$ of the clock signal ($V_L$+$V_\delta$). The result is that the output node has swing that is substantially close to a full logic swing, the output voltage being substantially close to either the high or low of the clock signal. As FIG. 3 shows, there is no $V_t$ drop at the output 20.

One disadvantage of this circuit is that the circuit is precharged on one phase of the clock signal and evaluates the logic input or inputs on only one phase of the clock signal, thus taking, in effect, a full clock cycle to compute a logic function. Taking a full clock cycle to perform a logic function may be disadvantageous in some cases where speed of the computation is an issue. Therefore, there is a need to have a faster logic circuit that retains the benefits of low-power full swing operation.

BRIEF SUMMARY OF THE INVENTION

The present invention is directed towards the above need. A logic circuit, in accordance with one embodiment of the present invention, includes a logic path, a pre-discharge path and a control circuit. The logic path is connected between a clock input and an output node and includes one or more transistors configured to evaluate a logic function of a data signal on at least one input during an evaluation phase. The pre-discharge path is connected between the clock input and the output node and includes an n-channel transistor having a gate and a channel definable between a source and drain region of the transistor, the channel being connected between the output node and the clock input. The control circuit has an output connected to the gate of the pre-discharge path transistor and is configured to maintain a source-to-gate voltage on the pre-discharge path transistor such that, independent of the states of the data input and the output node, the channel of the pre-discharge transistor provides a conductive path between the output node and the clock input during a pre-discharge phase.

Another logic circuit in accordance with the present invention includes a precharge path, first and second control circuits, first and second logic paths and a pre-discharge path. The precharge path is connected between a clock input and a first output node and includes a p-channel transistor for charging the first output node to a first voltage (high) on the clock input. The first control circuit is configured to provide a gate voltage to the p-channel transistor so that the p-channel transistor conducts while the first voltage is on the clock input. The first logic path is connected between the clock input and the first output node and has a first data input. The first logic path is configured to evaluate a logic function of the first data input during the second (low) voltage of the clock input. The pre-discharge path is connected between the clock input and a second output node and includes an n-channel transistor for pre-discharging the second output node to the second voltage on the clock input. The second control circuit is configured to provide a gate voltage to the n-channel transistor so that the n-channel transistor conducts while the second voltage is on the clock input. The second logic path is connected between the clock input and the second output node and has second data input. The second logic path is configured to evaluate a logic function of the second data input during the first (high) voltage of the clock input. The logic circuit provides logic evaluations when either the first or second voltage is present on the clock input.

An advantage of the present invention is that logic evaluations can be made on each phase of the waveform on the clock input, thereby making logic evaluations available to other circuit more quickly than if logic evaluations were made on only one phase of the clock waveform.

BRIEF DESCRIPTION OF THE DRAWINGS

These and other features, aspects and advantages of the present invention will become better understood with regard to the following description, appended claims, and accompanying drawings where:

DETAILED DESCRIPTION OF THE INVENTION

Figure 1:
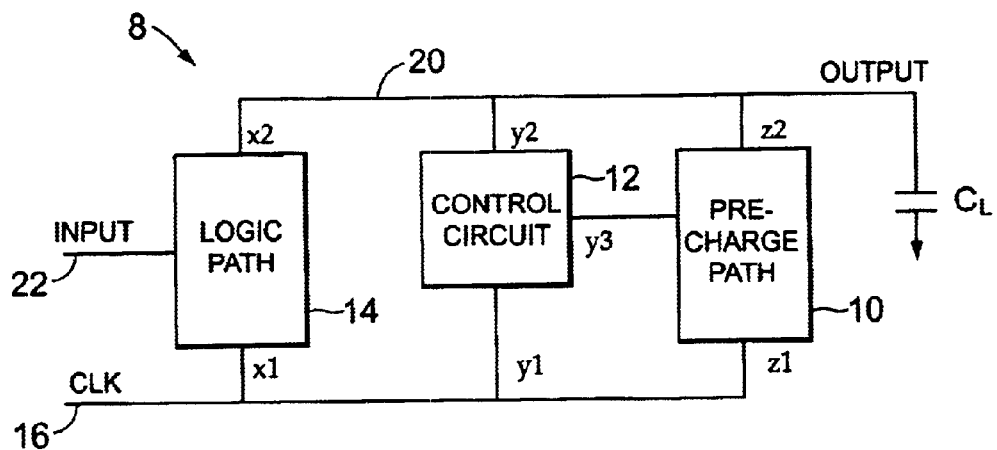
FIG. 1 shows the general arrangement of a logic path, precharge path and control circuitry.
Figure 2:
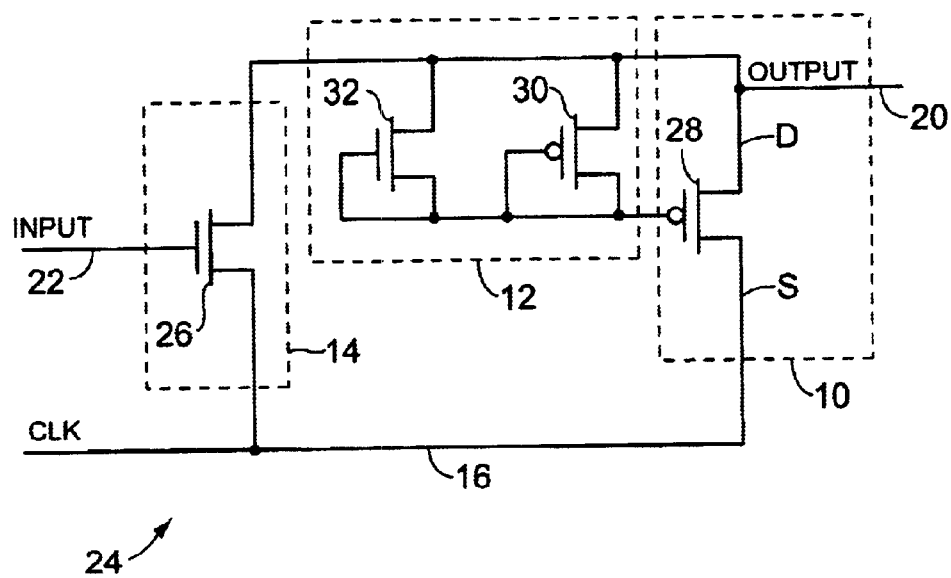
FIG. 2 shows an inverter circuit that requires a full-clock cycle to evaluate a logic function and is configured to evaluate during the low phase of the clock signal.
Figure 3:
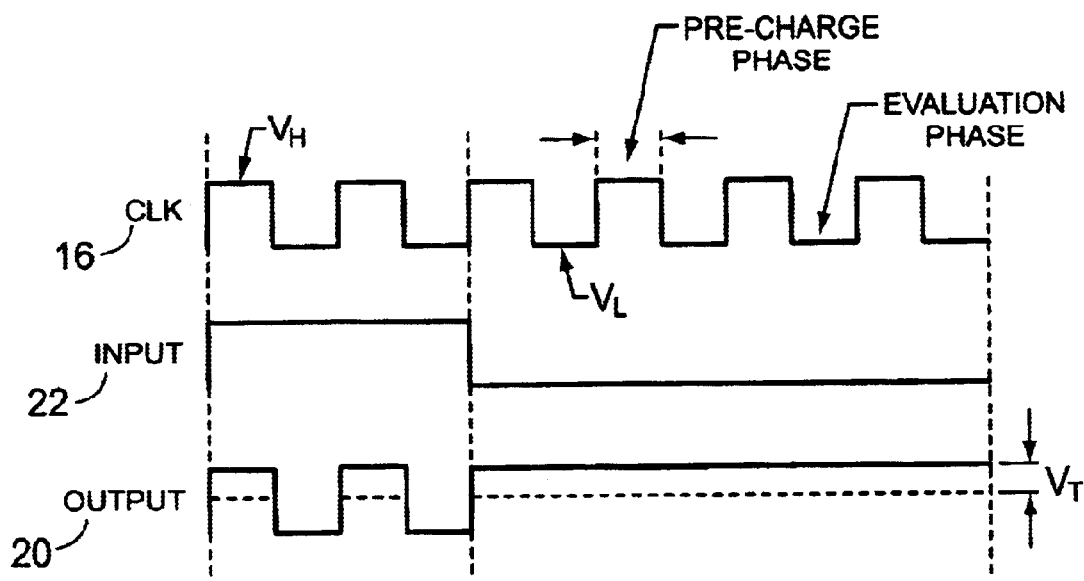
FIG. 3 shows a timing diagram by which the circuit of FIG. 2 operates.
Figure 4:
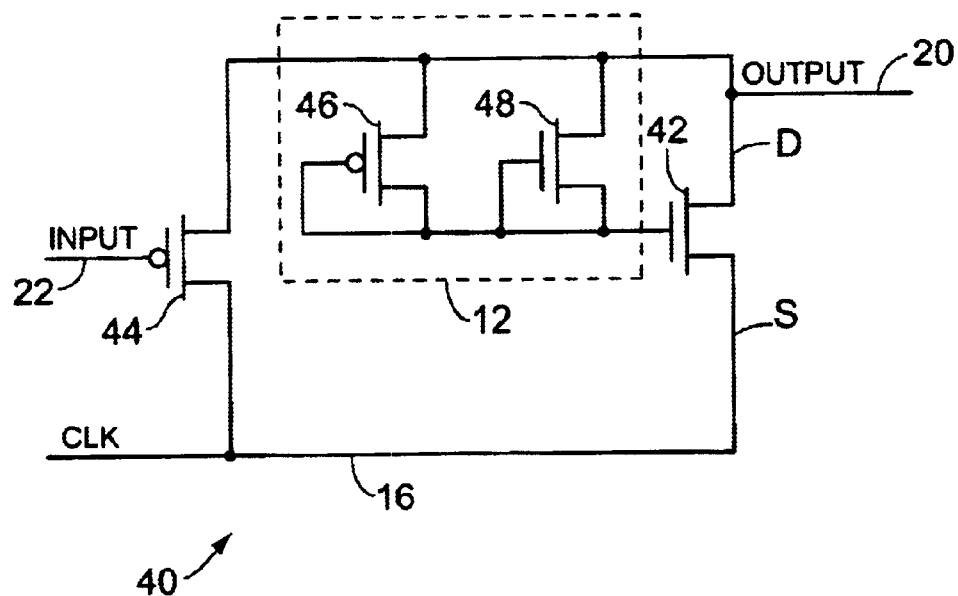
FIG. 4 shows an inverter circuit that requires a full-clock cycle to evaluate a logic function and is configured to evaluate during the high phase of the clock signal.

FIG. 4 shows an inverter circuit that requires a full-clock cycle to evaluate a logic function and is configured to evaluate during the high phase of the clock signal. The evaluate-high logic circuit of FIG. 4 includes a n-channel transistor 42 for the pre-discharge path and a p-channel transistor 44 for the logic path. The control circuit 12 is the same as for the evaluate-low logic circuit. The n-channel transistor has a drain connected to the output node 20, a source connected to the clock input 16 and a gate connected to the control circuit 12. The p-channel transistor 44 in the logic path implements the inverter function and provides a channel between the output node 20 and the clock input 16. The control circuit 12 includes two transistors, a p-channel transistor 46 and an n-channel transistor 48, each configured as a diode, and connected in parallel between the gate of the precharge transistor 42 and the output node 20.

Figure 5:
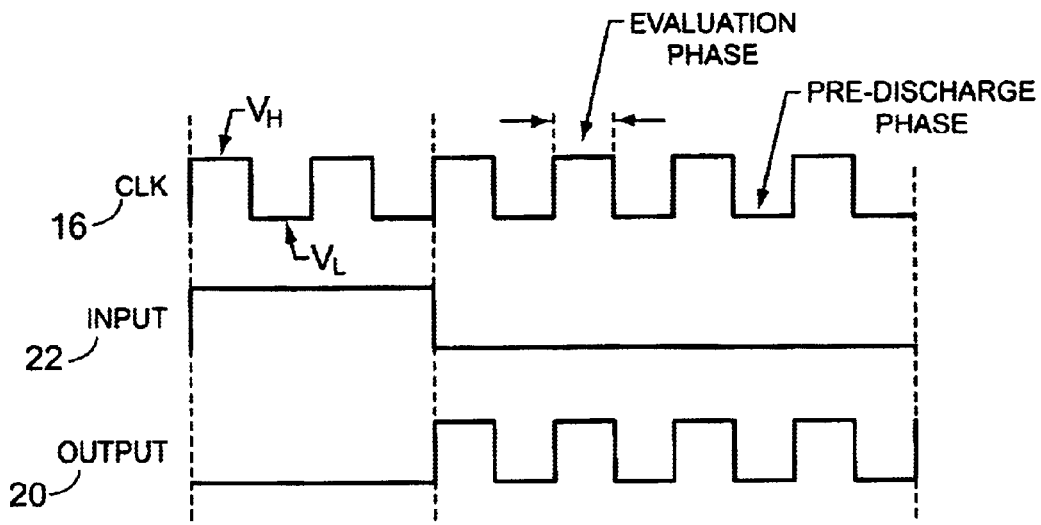
FIG. 5 shows a timing diagram by which the circuit of FIG. 4 operates.

FIG. 5 shows a timing diagram by which the circuit of FIG. 4 operates. During the time that the signal on the clock input is low, the n-channel pre-discharge transistor 42 couples the clock signal 16 to the output node 20 via its channel, to pre-discharge the output node 20 to a voltage substantially close to the logic low of the clock signal $(V_L+V_\delta)$. If the output node 20 was previously close to a logic high $(V_{out}=V_H-V_\delta)$, then the p-channel diode 46 provides a gate-to-source (the source node of transistor 42 being the node connected to the clock line 16, which has voltage $V_L$ on it) voltage $(V_{out}-V_{tp}-V_L)$ wherein $V_{tp}$ is the threshold voltage of the p-channel diode, to the n-channel precharge transistor 42, the gate-to-source voltage being sufficient to drive the transistor 42 into the constant current region (CCR), thereby discharging the output node 20 to the clock line 16. As the voltage $V_{out}$ on the output node 20 drops to $(V_L+V_\delta)$, the p-channel diode 46 turns off, but the n-channel diode 48 maintains sufficient excess gate-to-source voltage $(V_{out}+V_{tn})-V_L=(V_{tn}+V_\delta)$ on the n-channel precharge transistor 42 so that the n-channel precharge transistor 42 stays on.

During the time that the signal on the clock input 16 is high, the n-channel pre-discharge transistor 42 turns off because the p-channel diode 46 is back-biased and the n-channel diode 48 does not provide any excess gate voltage to the pre-discharge transistor 42. The p-channel logic path 44 evaluates the logic function on its input during the clock signal high time. If the input 22 is high, the p-channel logic path 44 is off and the output node 20 stays low. If the input 22 is low, the p-channel logic path 44 is on and the output node 20 is charged to a voltage substantially close to the logic high of the clock signal $(V_H-V_\delta)$.

Figure 6:
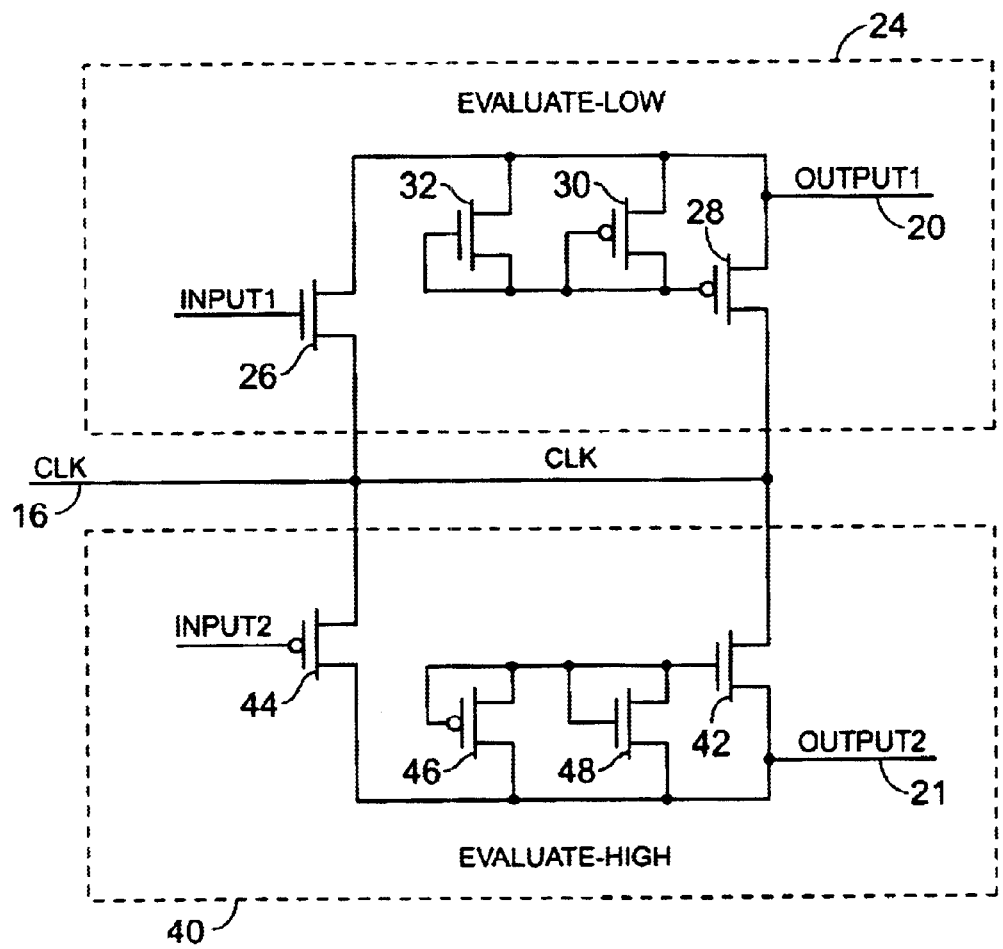
FIG. 6 shows a combination of an evaluate-low and evaluate-high logic circuit.

FIG. 6 shows a combination of an evaluate-low 24 and evaluate-high logic circuit 40. The combination of an evaluate-low and evaluate high logic circuit produces a set of circuits which evaluate logic functions in each half cycle of the signal of the clock input.

In operation, during the time when the signal on the clock input is high, the evaluate-low circuit 24 precharges its output node 20 to a voltage close to a logic high and the evaluate-high circuit 40 evaluates at its output 21 the logic function of its input, Input2. During the time when the signal on the clock input is low, the evaluate-low circuit 24 evaluates a logic function of its input, Input1, and the evaluate-high circuit pre-discharges its output node.

Figure 7:
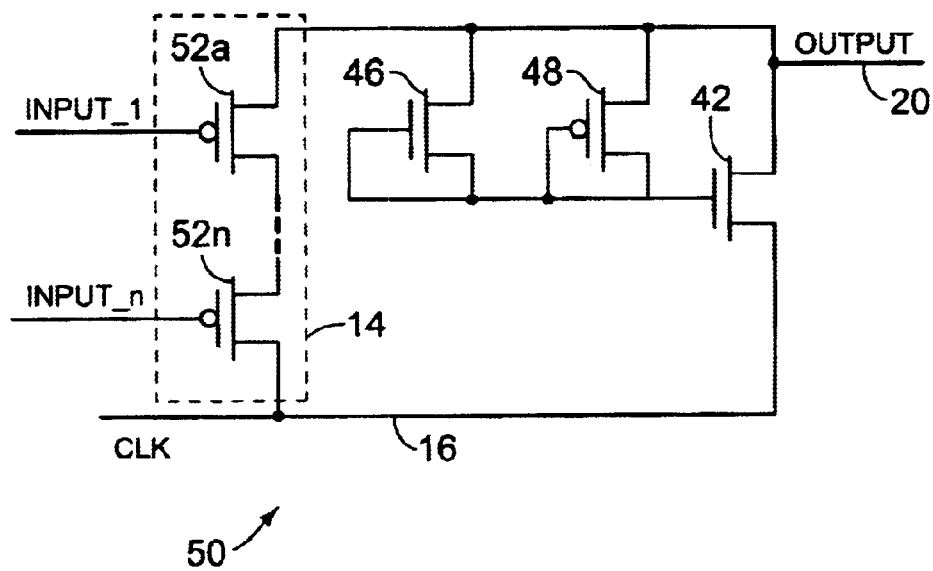
FIG. 7 shows an implementation of an evaluate-high AND gate.

FIG. 7 shows an implementation of an evaluate-high AND gate 50, in accordance with the present invention. In this circuit, the logic path 14 becomes a plurality of series-connected p-channel transistors 52a–52n, each receiving on its gate, one of the inputs, input_1-input_n, of the AND gate 50. Only if all of the inputs are low, while the signal on the clock input 16 is high, does the circuit charge the output node 20 from the logic high signal on the clock input 16, thereby implementing a multi-input, negative logic AND function.

Figure 8:
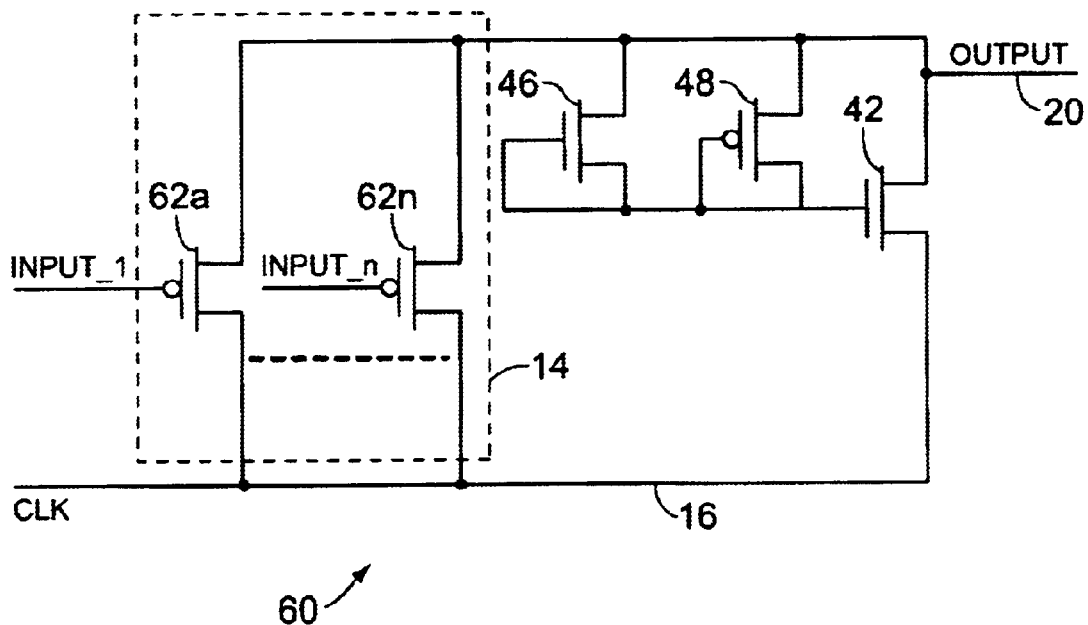
FIG. 8 shows an implementation of an evaluate-high OR gate.

FIG. 8 shows an implementation of an evaluate-high OR gate 60, in accordance with the present invention. In this circuit, the logic path becomes a plurality of parallel-connected p-channel transistors 62a–62n, each receiving on its gate, one of the inputs, input_1-input_n, of the OR gate. If any one of the inputs is low, while the clock is high, then the circuit charges the output node 20 from the high signal on the clock input 16, thereby implementing a multi-input, negative logic OR function.

Figure 9:
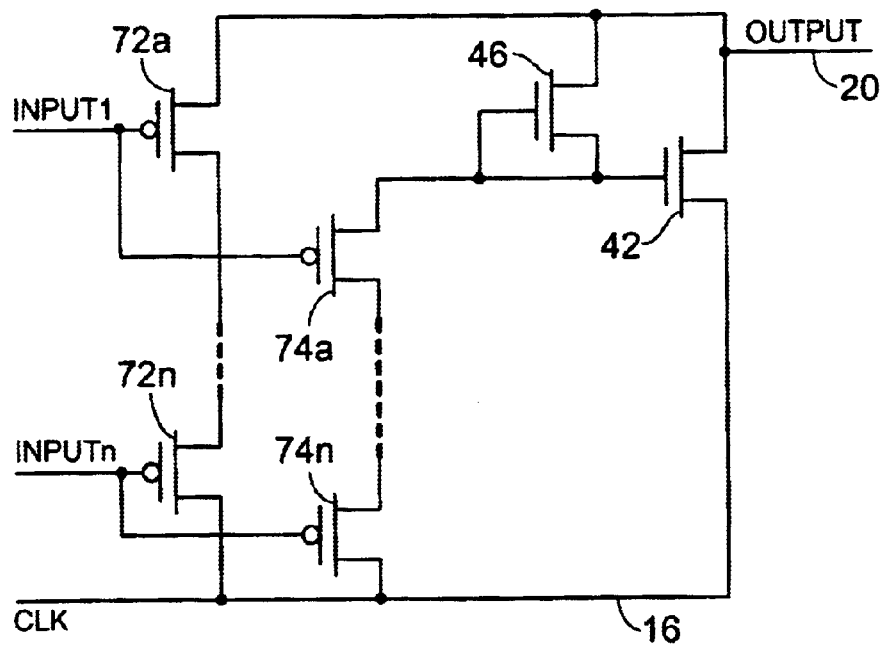
FIG. 9 shows an implementation of an evaluate-high AND gate with improved drive capability.

FIG. 9 shows an implementation of an evaluate-high AND gate 70 with improved drive capability, in accordance with the present invention. In this circuit, the p-channel diode 48 is removed and a plurality of series-connected transistors 74a–74n is added between the gate of the pre-discharge transistor 42 and the clock input 16. When the signal on the clock input 16 is high, i.e., during the evaluation phase, and all of the inputs are low, not only the output node 20 but the gate of the pre-discharge transistor 42 are charged. This biases the gate of the pre-discharge transistor 42 so that in the next pre-discharge phase, the gate has a voltage approximately equal to $V_{out}$, instead of $V_{out}-V_{tp}$, thereby increasing the excess gate voltage during the pre-discharge phase. This improves the drive characteristics of the pre-discharge transistor 42.

Figure 10:
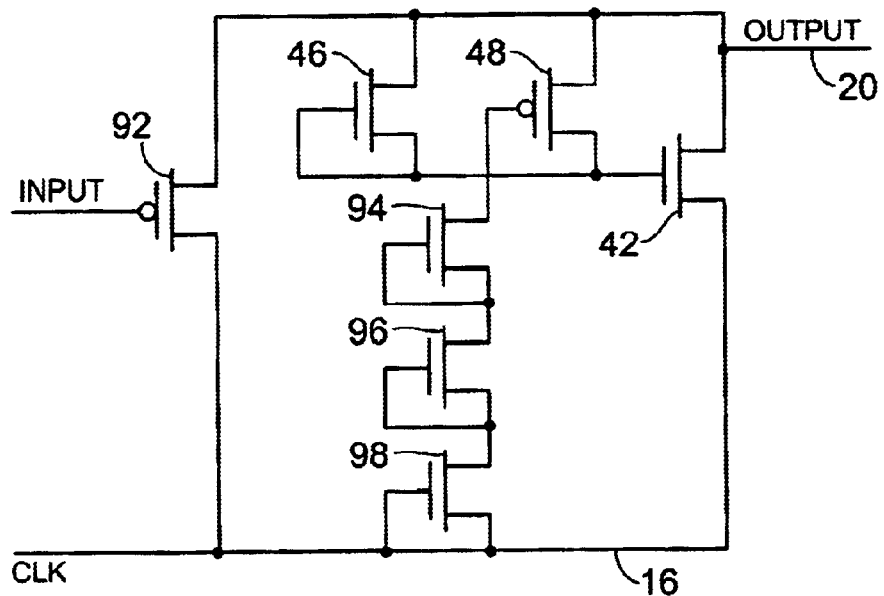
FIG. 10 shows an implementation of an evaluate-high INVERTER gate with reduced charge-pump effect.

FIG. 10 shows an implementation of an evaluate-high INVERTER gate 90 with reduced charge-pump effect. A stack of n-channel diodes 94, 96, 98 is connected between the gate of the pre-discharge transistor 42 and the clock input 16, with the positive side of the diode stack 94–98 connected to the clock input 16 and the negative side connected to the gate of the pre-discharge transistor 42. This diode stack 94–98 serves to set, during the evaluation phase, the voltage between on the gate of the pre-discharge transistor 42 to be approximately ($V_H$–$3V_{tn}$), where $V_H$ is the high voltage on the clock input and $V_{tn}$ is the threshold drop across each diode. Setting this voltage guarantees there is sufficient excess gate voltage to maintain the pre-discharge transistor 42 in the constant-current region, even when the gate of the pre-discharge transistor 42 is not discharged for a long period of time.

Although the present invention has been described in considerable detail with reference to certain preferred versions thereof, other versions are possible. Therefore, the spirit and scope of the appended claims should not be limited to the description of the preferred versions contained herein.

What is claimed is:

1. A logic circuit comprising:
    a logic path connected between a clock input and an output node, the logic path including one or more transistors configured to evaluate a logic function of a data signal on at least one input during an evaluation phase;
    a pre-discharge path connected between the clock input and the output node, the pre-discharge path including an n-channel transistor having a gate and a channel definable between a source and drain region of the n-channel transistor, the channel being connected between the output node and the clock input; and
    a control circuit having an output connected to the gate of the pre-discharge path transistor, the control circuit configured to maintain a source-to-gate voltage on the pre-discharge path transistor such that, independent of the states of the data input and the output node, the channel of the pre-discharge path transistor provides a-conductive path between the output node and the clock input during a pre-discharge phase.

2. A logic circuit as recited in claim 1,
    wherein the control circuit is connected between the gate of the pre-discharge path transistor and the output node; and
    wherein the control circuit includes a p-channel transistor and an n-channel transistor, each transistor having a gate and a channel between a source and drain region of the transistor, the drain and gate of each transistor connected together to form a diode-connected transistor having a positive node and a negative node, the positive node of the p-channel diode connected to the output node and the positive node of the n-channel diode connected to the gate of the pre-discharge path transistor.

3. A logic circuit as recited in claim 2, wherein the control circuit further includes a plurality of diode-connected n-channel transistors that are connected in series, so as to conductive from a positive side of the plurality of diode-connected n-channel transistors to a negative side of the plurality of diode-connected n-channel transistors, the plurality connected between the gate of the pre-discharge path transistor and the clock input, the positive side of the plurality connected to the clock input and the negative side of the plurality connected to the gate of the pre-discharge path transistor.

4. A logic circuit as recited in claim 1, wherein the logic path includes a p-channel transistor having a gate and a channel between a source and drain region of the p-channel transistor, the channel of the p-channel transistor connected between the output node and the clock input, the gate receiving the data signal to implement an inverter function of the data signal at the output node.

5. A logic circuit as recited in claim 1,
    wherein there are two inputs for receiving data input signals; and
    wherein the logic path includes at least two p-channel transistors, each having a gate and a channel between a source and drain region of each transistor, the channels being connected in series to together form a conductive path between the output node and the clock input, each gate receiving one of the data input signals to implement, at the output node, a 2-input AND function of said inputs.

6. A logic circuit as recited in claim 5, wherein the control circuit includes a pair of p-channel transistors, each having a gate and a channel between a source and drain region of each transistor of the pair of p-channel transistors, the channels being connected in series to form a conductive path between the gate of the pre-discharge path transistor and the clock input, each gate of each one of the pair of p-channel transistors being connected to one of said two inputs.

7. A logic circuit as recited in claim 1,
    wherein there are two inputs for receiving data input signals; and
    wherein the logic path includes at least two p-channel transistors, each having a gate and a channel between a source and drain region of each transistor, each channel forming a conductive path between the output node and the clock input, each gate being connected to one of the two inputs to implement, at the output node, a 2-input OR function of the two inputs.

8. A logic circuit as recited in claim 1,
    wherein the clock input connects to a clock circuit; and
    wherein the clock input carries a signal provided by the clock circuit that captures energy from the output node via the pre-discharge path during the pre-discharge phase and provides a portion of the captured energy via the logic path to the output node during the evaluation phase based on the data input signal.

9. A method of controlling a pre-discharge path in a logic circuit that includes a logic path connected between an output node and a clock input and including one or more transistors for implementing a logic function of the logic circuit, the pre-discharge path including an n-channel transistor having a gate, and a channel connected between the clock input and the output node, the clock input carrying a clock signal cycling between a first voltage and a second voltage, the method comprising:
    enabling the pre-discharge path during the first voltage of the clock signal by providing to the gate of the n-channel transistor a voltage having a range of approximately a n-channel transistor threshold voltage above the first voltage of the clock input to one p-channel transistor threshold voltage below the second voltage of the clock input; and disabling the pre-discharge path by providing the second voltage of the clock signal.

10. A logic circuit comprising:

a precharge path connected between a clock input and a first output node and including a p-channel transistor for charging the first output node to a first voltage on the clock input;

a first control circuit for providing a gate voltage to the p-channel transistor so that the p-channel transistor conducts while the first voltage is on the clock input;

a first logic path connected between the clock input and the first output node and having a, first data input, the first logic path for evaluating a logic function of the first data input while a second voltage is on the clock input;

a pre-discharge path connected between the clock input and a second output node and including an n-channel transistor for pre-discharging the second output node to the second voltage on the clock input;

a second control circuit for providing a gate voltage to the n-channel transistor so that the n-channel transistor conducts while the second voltage is on the clock input; and a second logic path connected between the clock input and the second output node and having second data input, the second logic path for evaluating a logic function of the second data input while a first voltage is on the clock input;

wherein the logic circuit provides logic evaluations when either the first or second voltage is present on the clock input.

11. A method of evaluating a first logic path and a second logic path of a logic circuit that includes a precharge path and a pre-discharge path connected to a clock input, the clock input carrying a signal having a first and second clock phase, the method comprising:

pre-charging, from the clock input, a first output node while evaluating a logic function of the second logic path on a second output node, during the first clock phase; and pre-discharging the second output node while evaluating a logic function of the first logic path on the first output nodes during the second clock phase.

* * * * *